United States Patent [19]
Nilsson et al.

[11] 3,829,852
[45] Aug. 13, 1974

[54] ANALOG-TO-DIGITAL CONVERTER

[75] Inventors: Per-Erik Nilsson; Bengt-Ake Harald Sjogren, both of Karlskoga, Sweden

[73] Assignee: Aktiebolaget Bofors, Bofors, Sweden

[22] Filed: May 3, 1972

[21] Appl. No.: 249,805

[52] U.S. Cl. .................... 340/347 NT, 340/347 AD
[51] Int. Cl. .......................................... H03k 13/20
[58] Field of Search..340/347 NT, 347 CC, 347 AD

[56] References Cited

UNITED STATES PATENTS

| | | | |
|---|---|---|---|
| 2,824,285 | 2/1958 | Hunt | 340/347 NT |
| 3,316,547 | 4/1967 | Ammann | 340/347 AD |
| 3,316,547 | 4/1967 | Ammann | 340/347 NT |
| 3,458,809 | 7/1969 | Dorey | 340/347 NT |
| 3,462,758 | 8/1969 | Reynal | 340/347 NT |
| 3,500,384 | 3/1970 | Naydan et al. | 340/347 AD |

OTHER PUBLICATIONS

J. R. Jones – IBM Tech. Discl. Bulletin, Vol. II, No. 8, Jan. 1969, pages 932–933.

*Primary Examiner*—Malcolm A. Morrison
*Assistant Examiner*—Vincent J. Sunderdick
*Attorney, Agent, or Firm*—Pollock, Philpitt & Vande Sande

[57] ABSTRACT

An analog-to-digital converter comprising:
an integrating circuit producing an output signal;
a counter for producing a digital representation;
first means for controlling the counter and the integrating circuit to perform a conversion cycle wherein for a period of predetermined length, starting when the output signal reaches a predetermined level different from its level at the start of the conversion cycle, the integrating circuit integrates an analog signal and thereafter integrates a reference signal of opposite polarity to the analog signal, and the counter is controlled to produce a digital representation of the analog signal in terms of the reference signal; second means for controlling the integrating circuit to integrate an auxiliary signal of the same polarity as that of the analog signal for at least part of the time from the start of the conversion cycle until the output signal of the integrating circuit reaches the predetermined level.

6 Claims, 2 Drawing Figures

ANALOG-TO-DIGITAL CONVERTER

BACKGROUND OF THE INVENTION

This invention relates to an analog-to-digital converter, and in particular to an analog-to-digital converter comprising:

an integrating circuit producing an output signal;

a counter for producing a digital representation;

first means for controlling the counter and the integrating circuit to perform a conversion cycle wherein for a period of predetermined length, starting when the output signal reaches a predetermined level different from its level at the start of the conversion cycle, the integrating circuit integrates an analog signal and thereafter integrates a reference signal of opposite polarity to the analog signal; and the counter is controlled to produce a digital representation of the analog signal in terms of the reference signal. Such a converter will hereinafter be referred to as an analog-to-digital converter of the dual integrating type.

The first means may comprise a generator for generating a series of clock pulses; a control circuit for controlling transmission of the clock pulses to the pulse counter; and a level comparator connected between the integrating circuit and the control circuit.

The first means then controls the pulse counter and the integrating circuit to perform a conversion cycle wherein for a first period of predetermined length, starting when the output signal of the integrating circuit reaches a predetermined level different from its level at the start of the conversion cycle, the integrating circuit integrates an analog signal so that the output signal varies substantially linearly to reach a second level at the end of the first period at which time the pulse counter is full, and then for a second period the integrating circuit integrates a reference signal of opposite polarity to the analog signal while the output signal of the integrating circuit varies substantially linearly back from said second level to said predetermined level, whereupon the transmission of clock pulses to the pulse counter is stopped and the pulse counter displays a digital representation of the analog signal in terms of the reference signal.

In such a converter, the threshold level of the comparator must always be greater than or equal to the starting value of the output signal from the integrating circuit. In order to fulfill this requirement in a converter comprising a comparator of conventional type which, as is known, has relatively high threshold level drifting, the threshold level in the comparator must be relatively far from the starting value of the output signal of the integrator. Such a converter will be very slow for exceptionally weak analog signals, as it takes a long time for the output signal from the integrating circuit to reach the threshold level of the comparator.

By using a comparator of a more sophisticated kind, having low threshold level drifting, it is possible to build a converter that is rapid even for exceptionally weak analog signals, since the threshold level in the comparator can then be set near the starting value for the output signal from the integrating circuit without any risk that the above-mentioned conditions will not be fulfilled. However, such a comparator will be considerably more expensive than one built with conventional components.

SUMMARY OF THE INVENTION

According to the invention an analog-to-digital converter of the dual integrating type as hereinbefore defined is provided with second means for controlling the integrating circuit to integrate an auxiliary signal for at least part of the time from the start of the conversion cycle until the output signal of the same polarity as that of the analog signal of the integrating circuit reaches the predetermined level.

Specific embodiments of the invention can achieve an analog-to-digital converter of the dual integrating type which is rapid even for exceptionally weak analog signals, even though a comparator of conventional type is used.

BRIEF DESCRIPTION OF THE DRAWINGS

A specific embodiment of the invention will now be described by way of example with reference to the accompanying drawings, wherein.

DESCRIPTION OF THE PREFERRED EMBODIMENT

Figure 1:
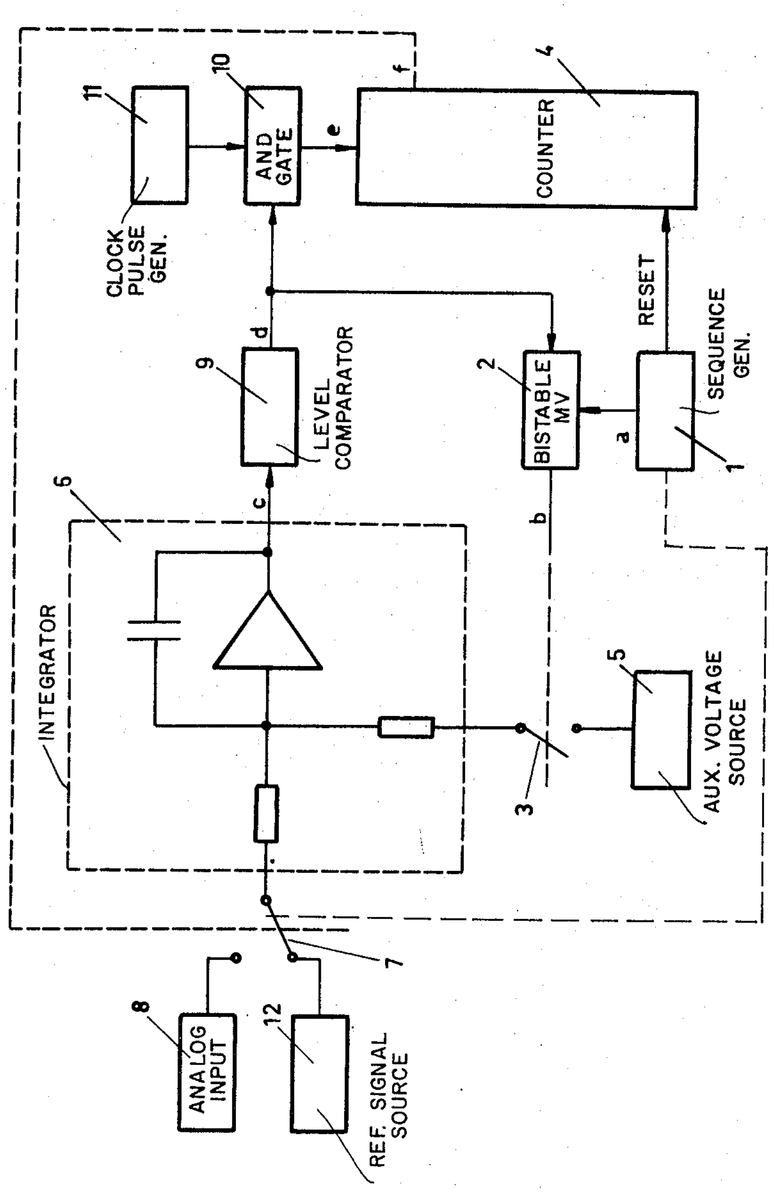
FIG. 1 shows a block diagram of a converter according to the invention.
Figure 2:
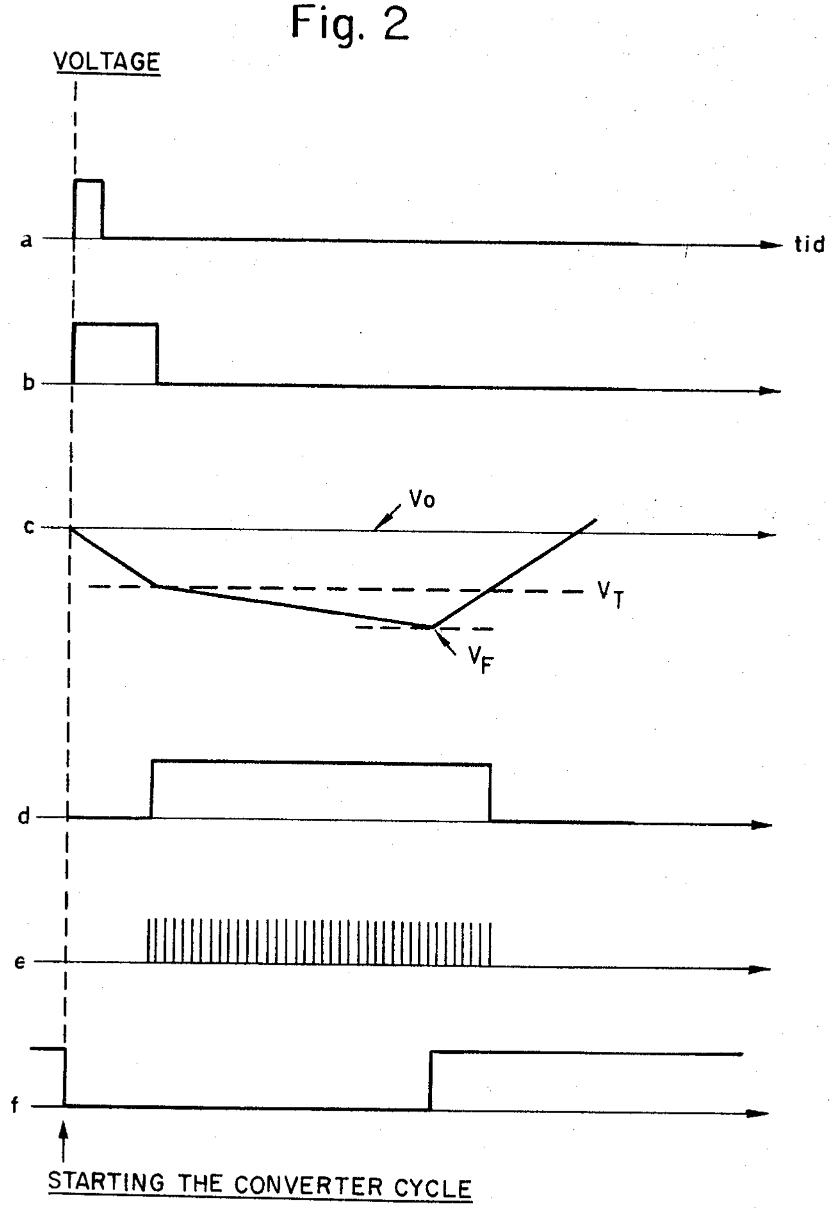
FIG. 2 shows the voltage as a function of time for various points in the converter of FIG. 1.

In FIG. 1, the reference numeral 1 designates a sequence generator, which may be automatic or manual, which starts a conversion cycle by transmitting a pulse (diagram *a* in FIG. 2) to a bistable multivibrator 2, which is then set (diagram *b* in FIG. 2) and via a driving circuit of a known kind, not shown in the Figure, a switch 3 is closed. Said pulse also sets a counter 4 at zero. When the switch 3 is closed, an auxiliary voltage source 5 is connected to the input of an integrating circuit 6. At the same time, change-over switch 7 is operated to cause the source 8 for the analog signal that is to be converted to be connected to the input of the integrating circuit 6. The auxiliary signal is selected to have the same polarity as the analog signal being converted. From diagram C in FIG. 2 it will be noted how the output signal from the integrating circuit 6, during the integration varies substantially linearly from a starting level $V_0$ to a predetermined first level $V_T$ which is equal to the threshold level in a level comparator 9. The auxiliary voltage is chosen so high that said variation takes place rapidly, even if the analog signal is extremely weak.

Just when the output signal from the integrator 6 passes the threshold level, there is a jump in the output signal of the comparator (diagram d in FIG. 2) which resets the multivibrator 2. Switch 3 is thereby disconnected, and only the analog signal continues to be integrated during a first time interval of predetermined length. The previously mentioned comparator signal jump (diagram d in FIG. 2) is also transmitted to one of the inputs of an AND gate 10, the second input of which is connected to a clock pulse generator 11, whereby pulses begin to be transmitted to the counter 4 (diagram e in FIG. 2). At the end of the first time interval, the counter 4 is full, and the output signal from the integrating circuit 6 has reached a second level $V_F$, and by means of an overflow signal (diagram f in FIG. 2) the change-over switch 7 is then set so that the analog signal is disconnected from the input of the integrating circuit 6 and a reference signal source 12 is instead connected to said input. The reference signal has a polarity opposite that of the analog signal, and therefore the output signal from the integration circuit 6 will vary from the second level $V_F$ back to and past the first level $V_T$. When the output signal from the integration circuit 6 passes the threshold level $V_T$ of the comparator 9, the output signal from the comparator 9 ceases, the AND gate 10 is then closed, and no further pulses are transmitted from the clock pulse generator 11 to the counter 4. The number of pulses that have now been registered by the counter represent the relation between the analog signal and the reference signal.

What is claimed is:

1. An analog-to-digital converter comprising:

an integrating circuit, a clock pulse course, a counter, a reference signal source having a polarity opposite that of the analog signal, an auxiliary voltage source having the same polarity as that of the analog signal, first means effective upon the initiation of a conversion cycle to connect at least said auxiliary voltage source as an input to said integrating circuit until the output of the integrating circuit reaches a predetermined amplitude, said first means controlling said integrating circuit to integrate the analog signal for a predetermined time interval starting with the attainment by said integrating circuit of said predetermined amplitude, additional means for controlling said integrating circuit to integrate said reference signal for a second variable time interval beginning at the end of said predetermined time interval and until its output attains said predetermined amplitude, and means for controlling said counter to count said clock pulses throughout at least said second time interval whereby the count registered in said counter is a function of the amplitude of said analog signal in terms of said reference signal.

2. A converter according to claim 1 wherein said first means causes the integrating circuit to integrate both the analog signal and the auxiliary signal from the start of the conversion cycle until said first means causes the output signal of the integrating circuit to reach said predetermined level.

3. The converter of claim 1 wherein said first means further includes a comparator for permitting the application of pulses from said clock pulse source to said counter only throughout the time that said integrating circuit has an output at least equalling said predetermined amplitude, said counter controlling said first means to apply said analog signal to said integrating circuit only until said counter has reached a predetermined count at which time said counter controls said additional means to apply only said reference signal to said integrating circuit for said second interval.

4. The converter of claim 3 wherein said predetermined count of said counter is the maximum count of said counter.

5. The converter of claim 1 wherein said first means further includes comparator means distinctively responsive to the attainment by the output of said integrating circuit of said predetermined amplitude, and means controlled by said comparator means for disconnecting said auxiliary voltage source from the input of said integrating circuit.

6. The converter of claim 5 including sequence generating means, bistable circuit means being set by said sequence generating means at the start of a conversion cycle, said comparator when rendered distinctively responsive resetting said bistable circuit means, said controlled means being governed by said bistable circuit means only when in its set condition to apply said auxiliary voltage source to said integrating circuit.

* * * * *

PO-1050
(5/69)

UNITED STATES PATENT OFFICE
CERTIFICATE OF CORRECTION

Patent No. 3,829,852 Dated August 13, 1974

Inventor(s) PER-ERIK NILSSON and BENGT-AKE HARALD SJOGREN

It is certified that error appears in the above-identified patent and that said Letters Patent are hereby corrected as shown below:

Foreign Application Priority Data

May 12, 1971 Sweden . . . . . . . . . . .6151/71

Signed and sealed this 19th day of November 1974.

(SEAL)
Attest:

McCOY M. GIBSON JR.
Attesting Officer

C. MARSHALL DANN
Commissioner of Patents